United States Patent
Lin et al.

(10) Patent No.: US 10,290,342 B2
(45) Date of Patent: May 14, 2019

(54) METHODS AND APPARATUS FOR MEMORY PROGRAMMING

(71) Applicant: Alacrity Semiconductors, Inc., New Haven, CT (US)

(72) Inventors: James Lin, New Haven, CT (US); Tso-Ping Ma, New Haven, CT (US)

(73) Assignee: Alacrity Semiconductors, Inc., New Haven, CT (US)

( * ) Notice: Subject to any disclaimer, the term of this patent is extended or adjusted under 35 U.S.C. 154(b) by 0 days.

(21) Appl. No.: 15/505,795

(22) PCT Filed: Aug. 21, 2015

(86) PCT No.: PCT/US2015/046423
§ 371 (c)(1),
(2) Date: Mar. 23, 2017

(87) PCT Pub. No.: WO2016/029189
PCT Pub. Date: Feb. 25, 2016

(65) Prior Publication Data
US 2017/0287542 A1    Oct. 5, 2017

Related U.S. Application Data

(60) Provisional application No. 62/040,996, filed on Aug. 22, 2014.

(51) Int. Cl.
| | |
|---|---|
| G11C 11/22 | (2006.01) |
| H01L 27/105 | (2006.01) |
| G11C 29/44 | (2006.01) |
| G11C 29/00 | (2006.01) |
| G11C 7/10 | (2006.01) |
| G11C 29/04 | (2006.01) |

(52) U.S. Cl.
CPC .......... *G11C 11/2275* (2013.01); *G11C 11/22* (2013.01); *G11C 29/4401* (2013.01); *G11C 29/787* (2013.01); *H01L 27/105* (2013.01); *G11C 7/1006* (2013.01); *G11C 2029/0409* (2013.01); *G11C 2029/4402* (2013.01)

(58) Field of Classification Search
CPC .................................................. G11C 11/2275
USPC ......................................................... 365/145
See application file for complete search history.

(56) References Cited

U.S. PATENT DOCUMENTS

| | | | |
|---|---|---|---|
| 5,962,884 A | 10/1999 | Hsu et al. | |
| 6,031,754 A | 2/2000 | Derbenwick et al. | |
| 6,292,385 B1 * | 9/2001 | Kim | G11C 11/22 |
| | | | 365/145 |

(Continued)

OTHER PUBLICATIONS

International search report for PCT/US2015/046423, dated Dec. 30, 2015, 3 pages.

*Primary Examiner* — Huan Hoang
*Assistant Examiner* — Muna A Techane
(74) *Attorney, Agent, or Firm* — Danielson Legal LLC

(57) ABSTRACT

Methods and apparatus for programming a ferroelectric memory according to various desired and constraining characteristics, such as the retention of the data written to the memory, the endurance of the memory itself, both retention and endurance, power consumption, constraints on available voltage levels, etc. The characteristics of the signal used to write the data to memory (e.g., voltage, power, etc.) are selected to as to satisfy the various desired and constraining characteristics.

20 Claims, 19 Drawing Sheets

(56) References Cited

U.S. PATENT DOCUMENTS

| | | | |
|---|---|---|---|
| 6,411,548 B1 | 6/2002 | Sakui et al. | |
| 6,787,830 B2 | 9/2004 | Shimada et al. | |
| 6,894,549 B2 | 5/2005 | Eliason | |
| 7,609,540 B2 | 10/2009 | Kang | |
| 8,089,108 B2 | 1/2012 | Wilson et al. | |
| 8,139,388 B2 | 3/2012 | Takahashi et al. | |
| 8,295,078 B2 | 10/2012 | Okhonin et al. | |
| 8,304,823 B2 | 11/2012 | Boescke | |
| 8,467,223 B2 | 6/2013 | Kang | |
| 2004/0047172 A1 | 3/2004 | Komatsuzaki | |
| 2005/0073889 A1* | 4/2005 | Kang | G11C 7/1045 365/189.12 |
| 2006/0056225 A1* | 3/2006 | Hashimoto | G11C 11/22 365/145 |
| 2008/0158934 A1* | 7/2008 | Kang | G11C 11/22 365/145 |
| 2012/0314476 A1 | 12/2012 | Appenzeller et al. | |
| 2014/0223098 A1 | 8/2014 | Lee et al. | |
| 2016/0336069 A1* | 11/2016 | Lin | G11C 11/5657 |

* cited by examiner

METHODS AND APPARATUS FOR MEMORY PROGRAMMING

CROSS-REFERENCE TO RELATED APPLICATIONS

The present application is the national phase of International (PCT) Patent Application No. PCT/US2015/046423, filed internationally on Aug. 21, 2015, and claims the benefit of U.S. provisional application No. 62/040,996, filed on Aug. 22, 2014, the entire disclosure of each of which is incorporated by reference as if set forth in their entirety herein.

FIELD

This disclosure relates to a method of programming ferroelectric memory, including embodiments based on Ferroelectric-gated Field Effect Transistor (FeFET) memory, for different operating parameters. In particular, different methods of set and reset operations are exercised in order to create a different operational capacity within a ferroelectric memory, e.g., FRAM.

BACKGROUND

Random Access Memory (RAM) is a type of data storage that a computer processor can quickly access. It consists of an array of addressable storage cells that each stores bit(s) of information (either a zero or one per bit).

The currently prevalent RAM types fall into two general categories, static and dynamic. The storage unit of a static RAM (SRAM) cell is typically a bi-stable flip-flop whose state indicates the stored value. The storage unit of a dynamic RAM (DRAM) cell is typically an integrated circuit capacitor whose charge indicates the stored value. Because the capacitor leaks charge, DRAM requires control circuitry to "refresh" the stored data by reading each cell's stored value and writing it back. This refresh operation occurs as often as every few milliseconds. DRAM can structurally achieve a higher memory density than SRAM; therefore, it is cheaper and has broader applications in volatile memory.

The 1T1C DRAM cell is the current industry standard due to its simplicity and small size. Successive DRAM generations have gradually reduced the cell size by shrinking the transistor, thereby achieving higher memory densities and lower production costs. However, since the 1 Mb DRAM generation in the mid-1980's, the capacitor has been forced to assume increasingly complicated 3-dimensional structures to store enough charges for a given cell size. While variations on memory design have replaced the capacitor with an alternate secondary storage unit such as a resistor, magnetic tunnel junction (MTJ), etc., the presence of a secondary component has limited continued scalability.

While early MOS memory was originally a stand-alone component within the computer, recent memory development has focused on the integration of memory and logic on a single chip—a feat that allows for improved performance, lower power consumption, less board space requirements, and reduced number of chips, among other advantages. While SRAM is widely used as an embedded memory, it is subject to standby power dissipation and increased susceptibility to soft errors. Embedded DRAM can bypass these challenges and also allow for higher memory densities; however, the presence of the capacitor in existing DRAM designs has made it more difficult to integrate with standard CMOS processes.

FeFET-based memory may be used to perform the functions of DRAM (as illustrated in U.S. Pat. No. 6,067,244 to Ma [hereinafter "MA '244'"], the disclosure of which is hereby incorporated by reference in its entirety) as well as non-volatile memory (as illustrated in U.S. Pat. No. 5,198,994 to Natori, the disclosure of which is hereby incorporated by reference in its entirety). FIG. 4 presents the architecture of a typical FeFET cell, with the ferroelectric field effect transistor (FET) as its fundamental storage unit. Because the FeFET memory cells lack a capacitor or other secondary storage component, it is suitable for embedded applications and its size depends on only the transistor. FeFET memory also possesses a (1) long retention time that enables low refresh frequency and (2) a non-destructive read operation. The recent discovery of HfO2-based ferroelectrics has overcome the limitations of the state-of-the-art ferroelectric materials such as lead zirconate titanate (PZT) and strontium bismuth tantalate (SBT), making FeFET memory more suitable for commercial application.

SUMMARY

This summary is provided to introduce a selection of concepts in a simplified form that are further described below in the Detailed Description section. This summary is not intended to identify or exclude key features or essential features of the claimed subject matter, nor is it intended to be used as an aid in determining the scope of the claimed subject matter.

Embodiments of the present invention relate to methods and apparatus for programming a ferroelectric memory according to various desired and constraining characteristics, such as the retention of the data written to the memory, the endurance of the memory itself, both retention and endurance, power consumption, constraints on available voltage levels, etc. The characteristics of the signal used to write the data to memory (e.g., voltage, power, etc.) are selected to as to satisfy the various desired and constraining characteristics.

In one aspect, embodiments of the present invention relate to a method for programming a ferroelectric memory. A controller selects at least one desired performance characteristic for data to be stored in a ferroelectric memory. The controller determines at least one signal characteristic for a signal to be used to store the data in the ferroelectric memory, the signal characteristic satisfying the at least one desired performance characteristic. The controller applies the signal having the at least one determined signal characteristic to the ferroelectric memory to store the data with the at least one desired performance characteristic.

In one embodiment, the at least one desired performance characteristic is at least one of a desired retention characteristic, a desired endurance characteristic, a desired speed characteristic, a desired energy characteristic, and a desired error-rate characteristic.

In one embodiment, the ferroelectric memory is ferroelectric field effect transistor memory or ferroelectric random access memory.

In one embodiment, the at least one desired performance characteristic is selected from the group consisting of retention time, interval between refresh, read speed, set speed, read energy, set energy, refresh energy, read current, set current, refresh current, and read-out window.

In one embodiment, the signal characteristic is selected from the group consisting of signal current, signal voltage, signal power, signal duration, and signal waveform structure.

In one embodiment, the signal characteristic is selected to satisfy at least one of a constraint on power consumed, a constraint on electromagnetic field generation, a constraint on available voltage levels, a constraint on endurance, a constraint on error rate, and a constraint on retention time.

In one embodiment, the controller is a multiplexer or microprocessor.

In one embodiment, the at least one desired performance characteristic is selected based on an operation being executed by a microprocessor.

In one embodiment, the at least one desired performance characteristic is selected based on the timing of successive data storage operations.

In one embodiment, the ferroelectric memory for storage is selected from a plurality of ferroelectric memories based on the desired performance characteristic.

In another aspect, embodiments of the present invention relate to a system for programming a ferroelectric memory. The system includes a ferroelectric memory; and a controller configured to read data from and write data to the ferroelectric memory, wherein the controller determines at least one signal characteristic for a signal to be used to write data to the ferroelectric memory based on at least one desired performance characteristic for the data to be stored in the ferroelectric memory.

In one embodiment, the at least one desired performance characteristic is at least one of a desired retention characteristic, a desired endurance characteristic, a desired speed characteristic, a desired energy characteristic, and a desired error-rate characteristic.

In one embodiment, the ferroelectric memory is ferroelectric field effect transistor memory or ferroelectric random access memory.

In one embodiment, the controller selects the desired performance characteristic from the group consisting of retention time, interval between refresh, read speed, set speed, read energy, set energy, refresh energy, read current, set current, refresh current, and read-out window.

In one embodiment, the controller selects the signal characteristic from the group consisting of signal current, signal voltage, signal power, signal duration, and signal waveform structure.

In one embodiment, the controller selects the signal characteristic to satisfy at least one of a constraint on power consumed, a constraint on electromagnetic field generation, a constraint on available voltage levels, a constraint on endurance, a constraint on error rate, and a constraint on retention time.

In one embodiment, the controller is selected from the group consisting of a multiplexer and a microprocessor.

In one embodiment, the controller selects the desired performance characteristic based on an operation being executed by the microprocessor.

In one embodiment, the controller selects the desired performance characteristic based on the timing of successive data storage operations.

In one embodiment, the system further includes a plurality of ferroelectric memories and the ferroelectric memory for storage is selected from the plurality of ferroelectric memories based on the desired performance characteristic.

In yet another aspect, embodiments of the present invention relate to an integrated circuit containing ferroelectric memory cells utilizing segmentation. The circuit includes at least one segmentation, each segmentation comprising at least one ferroelectric memory cell and having at least one segmentation characteristic, wherein the ferroelectric memory cells within each segmentation are consistently programmed using signals having at least one consistent electrical characteristic.

In one embodiment, the at least one consistent electrical characteristic selected for signals to program a particular segmentation are selected for the at least one segmentation characteristic for that particular segmentation.

In one embodiment, the circuit further includes a controller for assigning at least one ferroelectric memory cell to a segmentation.

In one embodiment, the circuit further includes a controller for reassigning at least one ferroelectric memory cell from a first segmentation to a second segmentation. In one embodiment, the controller reassigns the at least one ferroelectric memory cell to reduce the difference between the endurance of the first segmentation and the second segmentation. In one embodiment, the controller reassigns the at least one ferroelectric memory cell to a randomly selected second segmentation.

In one embodiment, the circuit includes at least two ferroelectric memory cells, each ferroelectric memory cell contained in a separate physical package.

In one embodiment, the circuit includes a plurality of segmentations, wherein the plurality of segmentations is application specific.

In one embodiment, a first segmentation is used as a data cache and a second segmentation is used as a volatile memory.

These and other features and advantages, which characterize the present non-limiting embodiments, will be apparent from a reading of the following detailed description and a review of the associated drawings. It is to be understood that both the foregoing general description and the following detailed description are explanatory only and are not restrictive of the non-limiting embodiments as claimed.

BRIEF DESCRIPTION OF THE DRAWINGS

Non-limiting and non-exhaustive embodiments are described with reference to the following figures in which:

FIG. 5C (right) depicts the extent of the memory window erased as a function of erase voltage in a FeFET memory cell;

In the drawings, like reference characters generally refer to corresponding parts throughout the different views. The drawings are not necessarily to scale, emphasis instead being placed on the principles and concepts of operation.

DETAILED DESCRIPTION

Figure 1:
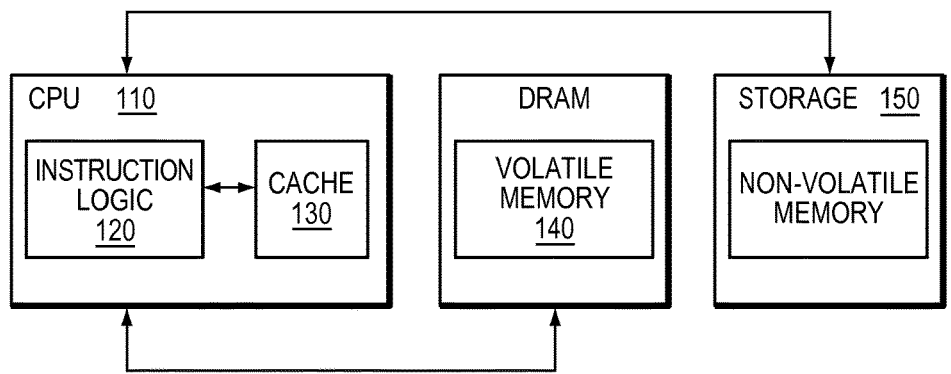
FIG. 1 is a block diagram depicting the processing, memory, and storage functions of a basic computer.

Various embodiments are described more fully below with reference to the accompanying drawings, which form a part hereof, and which show specific exemplary embodiments. However, embodiments may be implemented in many different forms and should not be construed as limited to the embodiments set forth herein; rather, these embodiments are provided so that this disclosure will be thorough and complete, and will fully convey the scope of the embodiments to those skilled in the art. Embodiments may be practiced as methods, systems or devices. Accordingly, embodiments may take the form of a hardware implementation, an entirely software implementation or an implementation combining software and hardware aspects. The following detailed description is, therefore, not to be taken in a limiting sense.

Reference in the specification to "one embodiment" or to "an embodiment" means that a particular feature, structure, or characteristic described in connection with the embodiments is included in at least one embodiment of the invention. The appearances of the phrase "in one embodiment" in various places in the specification are not necessarily all referring to the same embodiment.

Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the present invention include process steps and instructions that could be embodied in software, firmware or hardware, and when embodied in software, could be downloaded to reside on and be operated from different platforms used by a variety of operating systems.

The language used in the specification has been principally selected for readability and instructional purposes, and may not have been selected to delineate or circumscribe the inventive subject matter. Accordingly, the disclosure of the present invention is intended to be illustrative, but not limiting, of the scope of the invention, which is set forth in the claims.

Traditionally DRAM is used as a fast-access temporary storage system when moving data between the disk and processor is time sensitive. The following is the traditional hierarchy of memory within a computer system in which the first levels have the least amount of storage space, cost the most, and have the fastest performance while the later levels have the most storage space, cost the least, and have slower performance. Performance in this case can be defined as the read speed (time to read the memory) and the write speed (time to program to the memory).

The first level of memory, known as the instruction cache, is composed of registers inside the actual processor. The second level is usually also a part of the processor and is referred to as the data cache 130. The data cache can be further segmented into levels (L1, L2, L3, etc.) in the same relationship as described with memory (most modern CPUs have at least 2 levels of data cache). Subsequently, the memory used is a random access memory 140. These memories can be static or dynamic depending on the function of the system. Next, the memory is usually referred to as disk and refers to a nonvolatile memory product 150 that can store data longer (and without power). Finally, there is a class of memory called tertiary storage, which refers to removable media such as DVDs, CDs, tape, and disks.

In the traditional architecture, all levels before the disk level are traditionally thought of as volatile memories, meaning power is required to retain the data. Subsequent levels are referred to as nonvolatile.

Additionally in the current state of the art, the performance characteristics of each type of memory remain relatively constant and are well-defined. Performance characteristics for memory include but are not limited to read speed, write speed, read energy, write energy, data retention, endurance, and size.

This memory system is also primarily considered to exist across the entire CPU, but in the current state of the art, the same system applies to most graphics cards, which include their own dedicated dynamic random access memory (DRAM).

DRAM is a volatile memory, which means if the data is not refreshed within a certain time interval, the stored value can no longer be guaranteed to be accurate. The interval for the current state of the art DRAM is typically 64 ms.

FeFET Memory is a DRAM product that has the flexibility for certain performance characteristics to change depending on how data is written to the memory. At the simplest level, this means that depending on the type of operation(s) being executed, FeFET memory can provide more favorable characteristics than current state of the art DRAM. These benefits include lower power utilization, longer retention, higher density, and lower heat.

For example when rendering a video, if the resolution is 1000×800, at least 800,000 bytes of DRAM are programmed with the values of the pixels on the screen and must be refreshed at least every 64 ms. However in most video operation, less than 5% of the screen actually changes every 64 ms. Therefore, by programming an FeFET memory cell in a certain way, it would be possible to have a longer retention on the cell and access it less, which improves both power utilization and heat generation.

In terms of types of operations, the current state of the art has well-defined characteristics for how often DRAM is used during normal operation. Knowing the types of instructions being executed and programming an FeFET memory effectively can achieve tremendous savings and ultimately lead to lower cost.

FIG. 1 is a simplified block diagram of the processing and data storage functions of a typical computer utilizing FeFET memory in accord with the present invention. Three broad tiers of the memory hierarchy that the CPU 110 accesses through bi-directional data communication are described as follows: (1) the cache 130 within the CPU provides fast memory access; (2) DRAM 140 provides volatile data storage; and (3) storage 150, typically accessed through I/O circuitry or other control logic, provides non-volatile data storage.

Instruction logic 120 refers to the components of the Von Neumann architecture of the processor and arithmetic logic unit and also includes the instruction cache. The instruction cache is the fastest level of temporary storage that can be used by the processor to store calculations. Instruction cache memory is volatile in nature.

Cache 130 refers to the data cache component which can be broken down into several levels of cache, each level progressively larger in size, but slower in data access performance. Most modern architectures include at least two levels of cache in the data cache. The data cache is volatile in nature, and one embodiment of the invention would be implemented in the data cache.

Any or all of these memories may utilize FeFET memory in lieu of current DRAM technologies in accord with the present invention. For example, in one embodiment, FeFET memory is used as a standalone volatile memory 140. Some embodiments of data storage 150 may include a volatile memory cache for faster access; this cache could also utilize FeFET memory.

Figure 2:
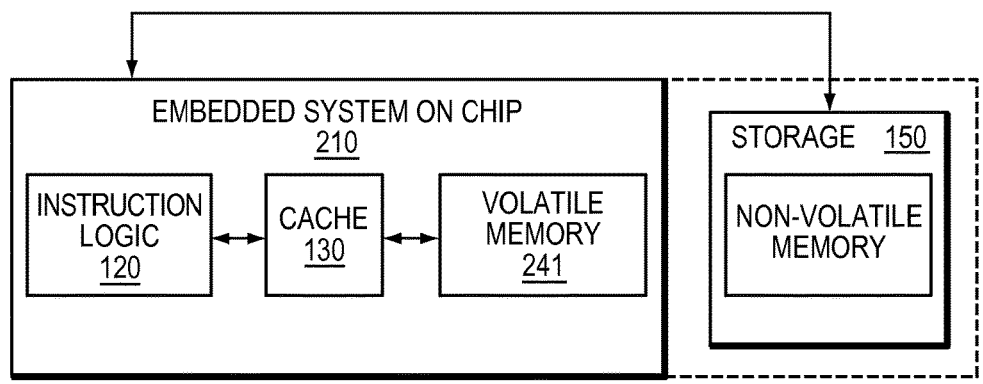
FIG. 2 is a block diagram depicting an embedded SoC with integrated on-chip memory supporting the core logic.

FIG. 2 is a simplified block diagram of a SoC 210 with on-chip FeFET memory. The embedded FeFET memory 241 provides memory support to the core logic function of the CPU 120. Note that, as previously mentioned, cache 130 and storage 150 can also be implemented as FeFET memory. In certain embodiments, storage 150 can also be integrated in the SoC 210.

Figure 3:
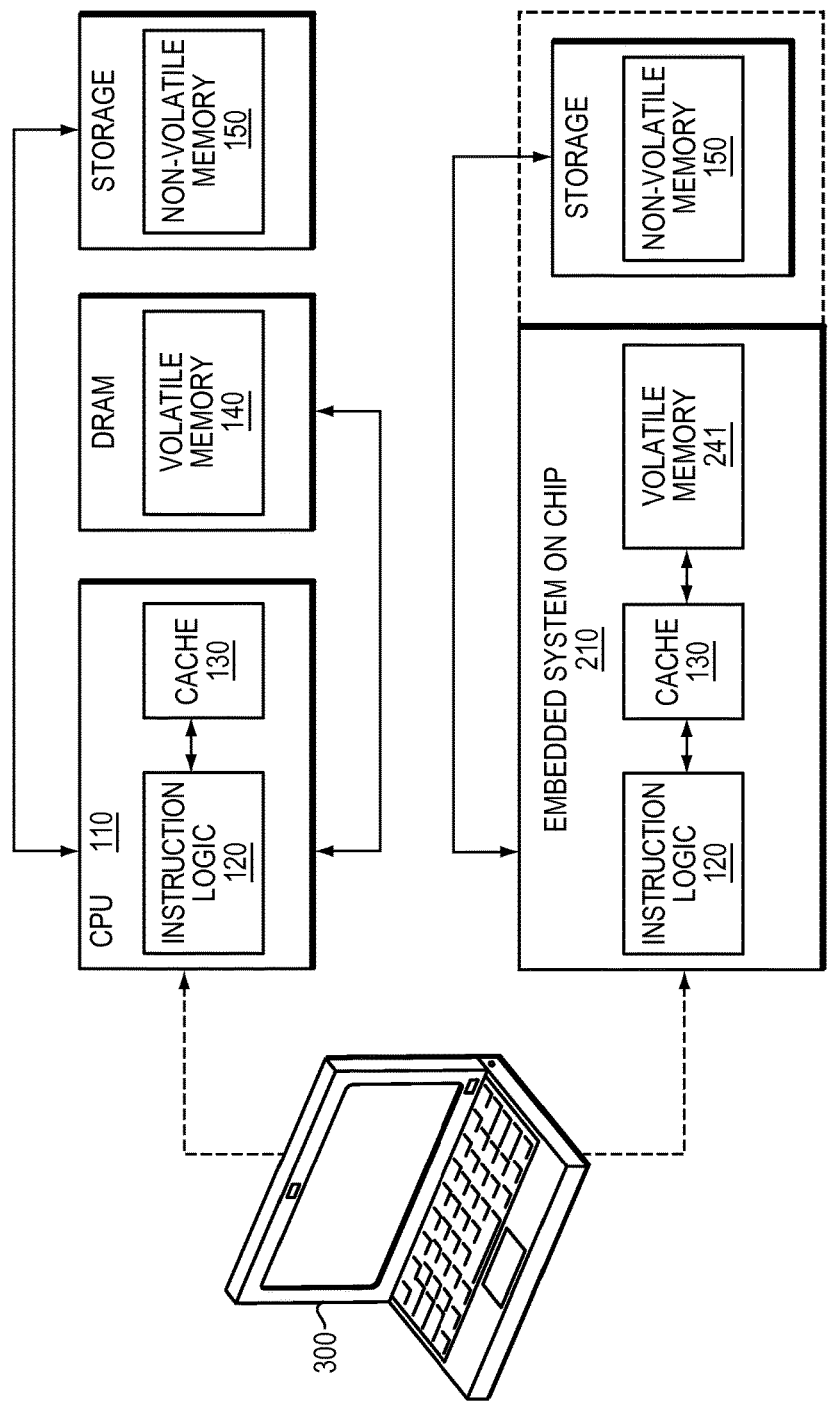
FIG. 3 is an illustration of a device that can be an embodiment of FIG. 1 or FIG. 2.

As shown in FIG. 3, a computing device such as a laptop 310 can utilize embodiments of the present invention, such as the conventional memory architecture of FIG. 1 or the SoC of FIG. 2, each embodiment utilizing FeFET memory in lieu of DRAM in one or more of its various components as discussed above.

Figure 4:
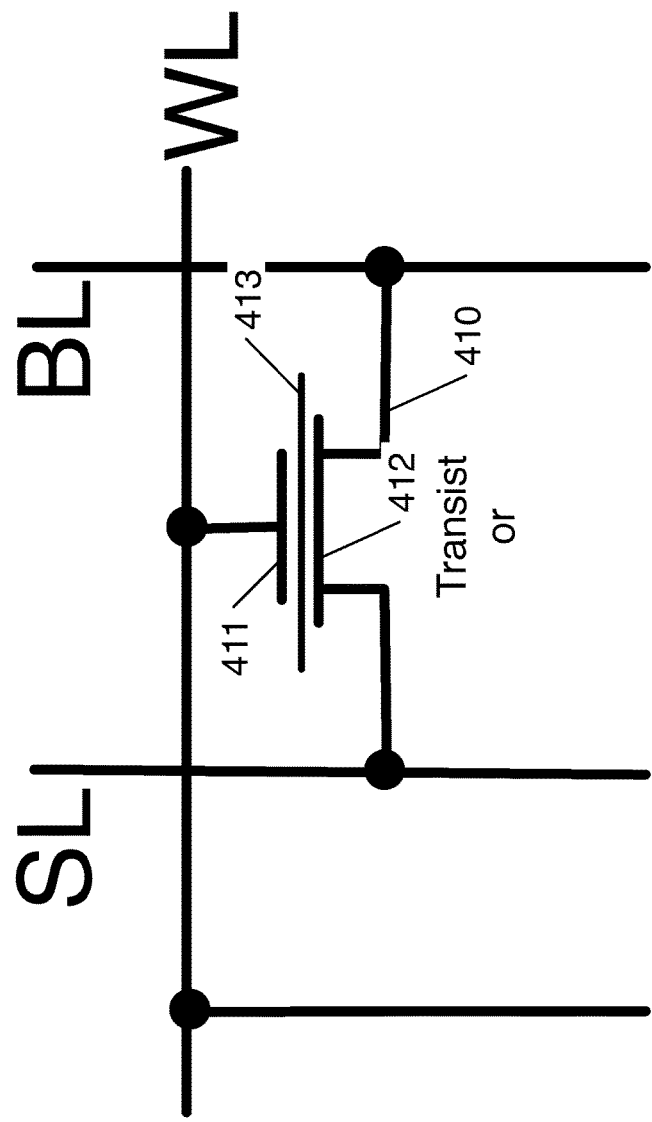
FIG. 4 is a circuit diagram depicting the single-transistor architecture of a typical FeFET memory cell.

FIG. 4 illustrates the single-transistor architecture of an FeFET memory cell. The fundamental storage unit of the cell is a ferroelectric field-effect transistor (FeFET) 410. The makeup of the FeFET may be, as a non-limiting example, metal layer 411, silicon layer 412, and the ferroelectric layer 413. Other structures are possible. FeFETs differ from traditional FETs by storing information in their ferroelectric layer. In one embodiment, such as that discussed in MA '244 (incorporated by reference as if set forth in its entirety herein), the ferroelectric layer is made of doped hafnium oxide.

Figure 5A:
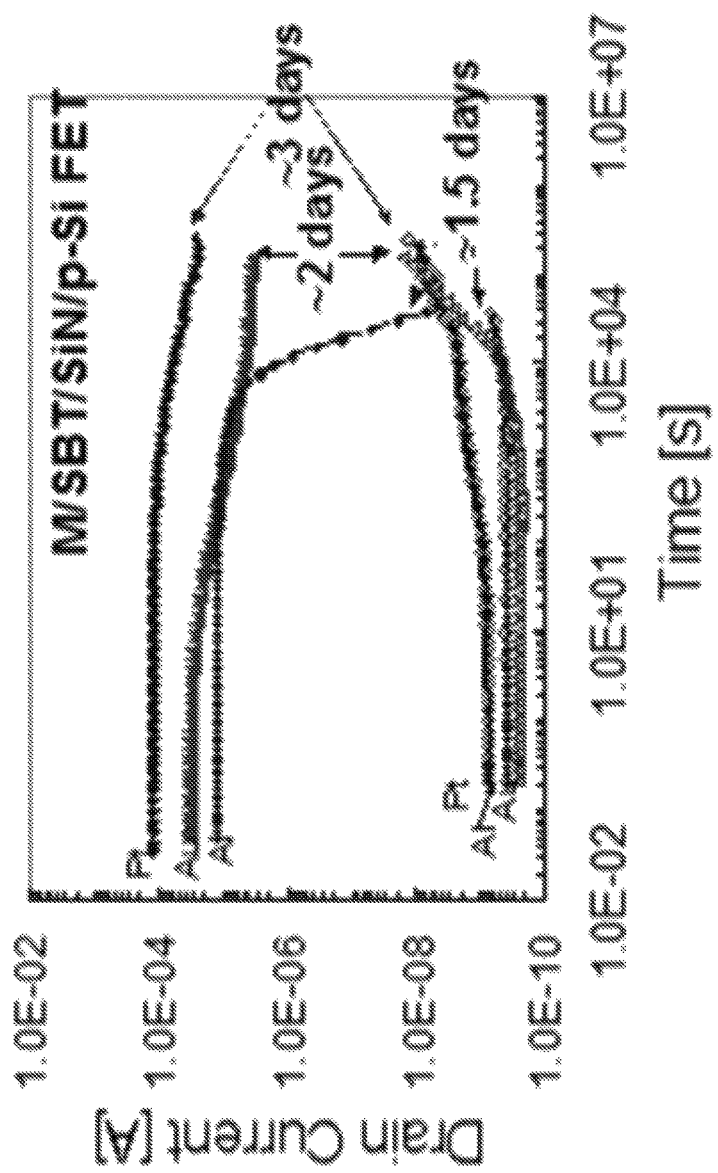
FIG. 5A illustrates the relationship between data retention time for various types of FeFET memory cells with different metallic electrodes.

FIG. 5A depicts the data retention time of the FeFET memory cell based on different types of metal electrodes. As depicted in FIG. 5A, the use of different gate and drain current magnitudes to program to the cell results in varying data retention characteristics.

Figure 5B:
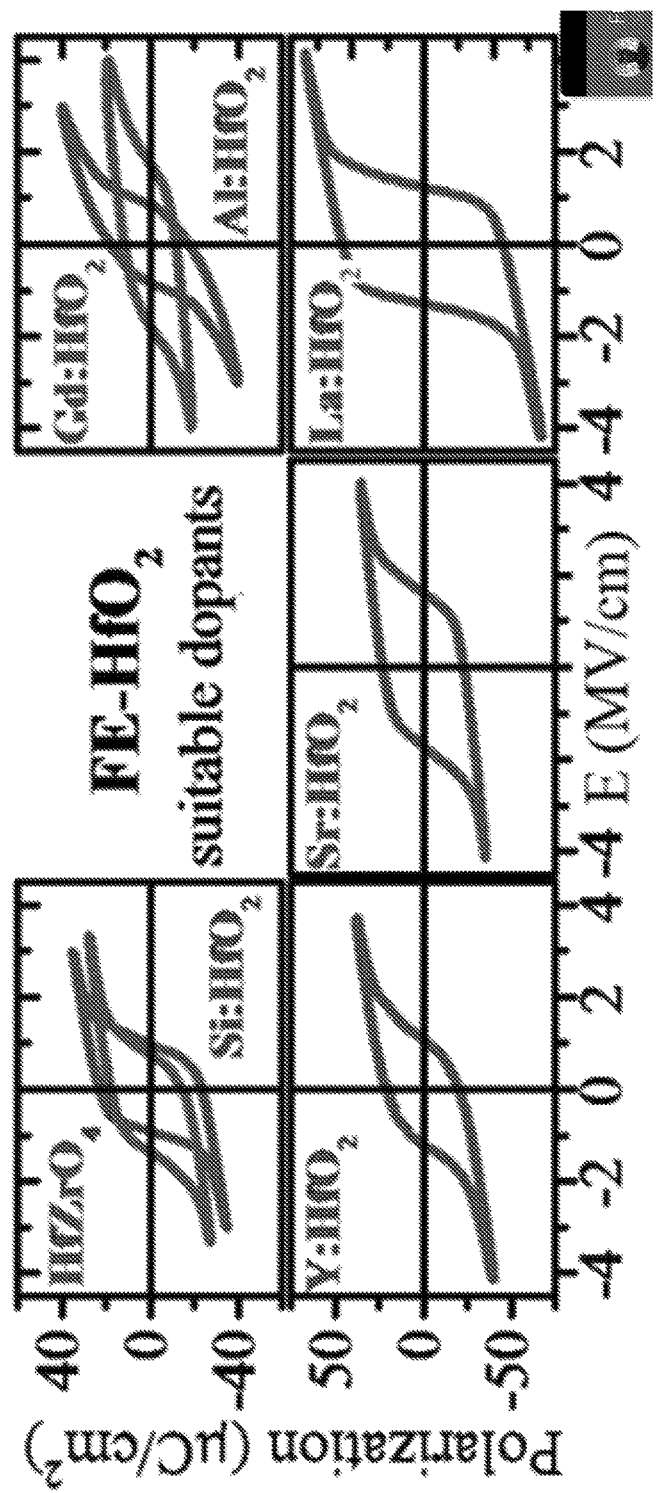
FIG. 5B illustrates the hysteresis properties of an FeFET memory cell varying by choice of construction materials.

FIG. 5B depicts the hysteresis of an FeFET memory cell varying by the composition of the ferroelectric materials and the cohesive voltage needed to program to an FeFET memory cell, i.e., at least that amount of voltage within the memory window of the hysteresis is required in order to successfully program an FeFET memory cell.

Figure 5C:
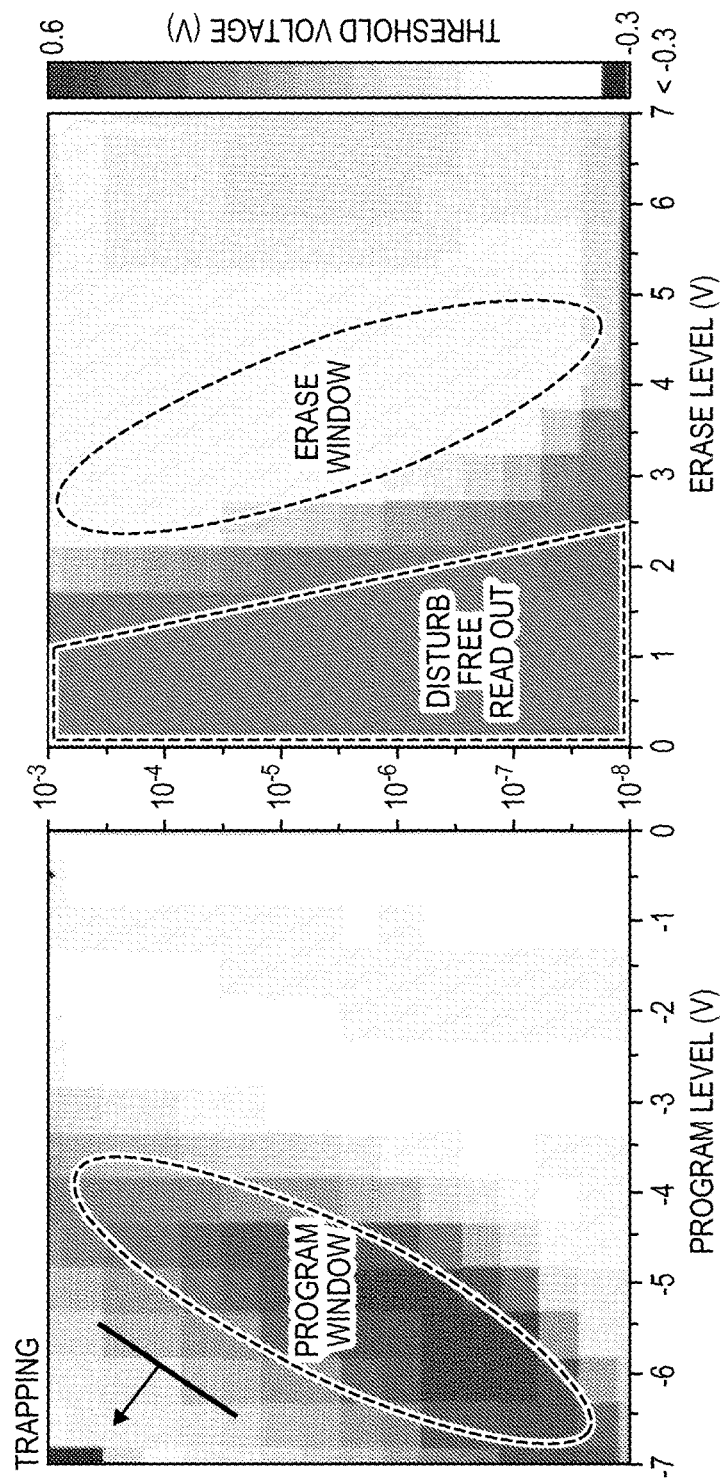
FIG. 5C (left) depicts the relationship of the programming window and programming time of an FeFET memory cell.

FIG. 5C (left) the relationship of the programming window and programming time of an FeFET memory cell. FIG. 5C (right) depicts the extent of the memory window erased as a function of erase voltage in a FeFET memory cell. These windows depict the values for the threshold voltage required to either set or reset an FeFET memory cell.

Figure 5D:
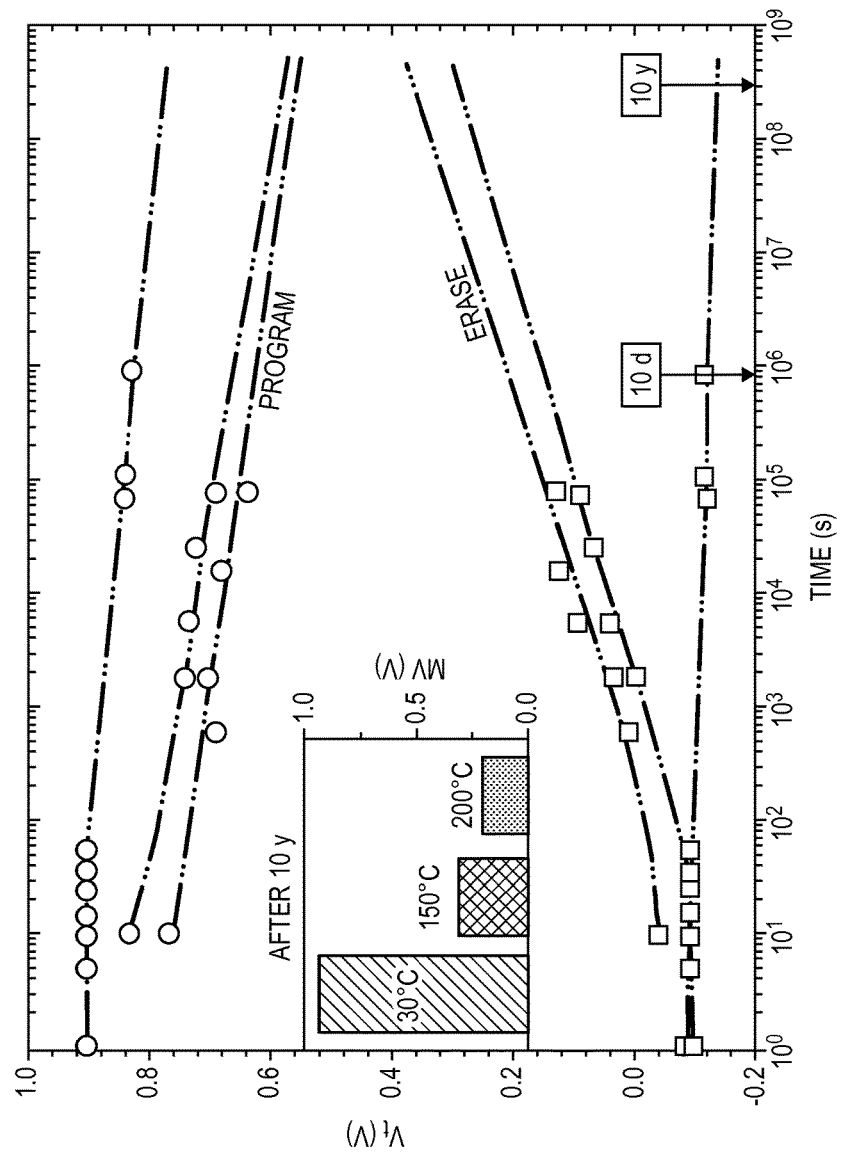
FIG. 5D illustrates the data retention of an FeFET memory cell.

FIG. 5D depicts the data retention of an exemplary ferroelectric hafnium oxide FeFET memory cell. FIG. 5D shows how long data is retained in the cell, effectively defining the interval between refreshes to ensure the data stored in the cell is considered reliable.

Figure 5E:
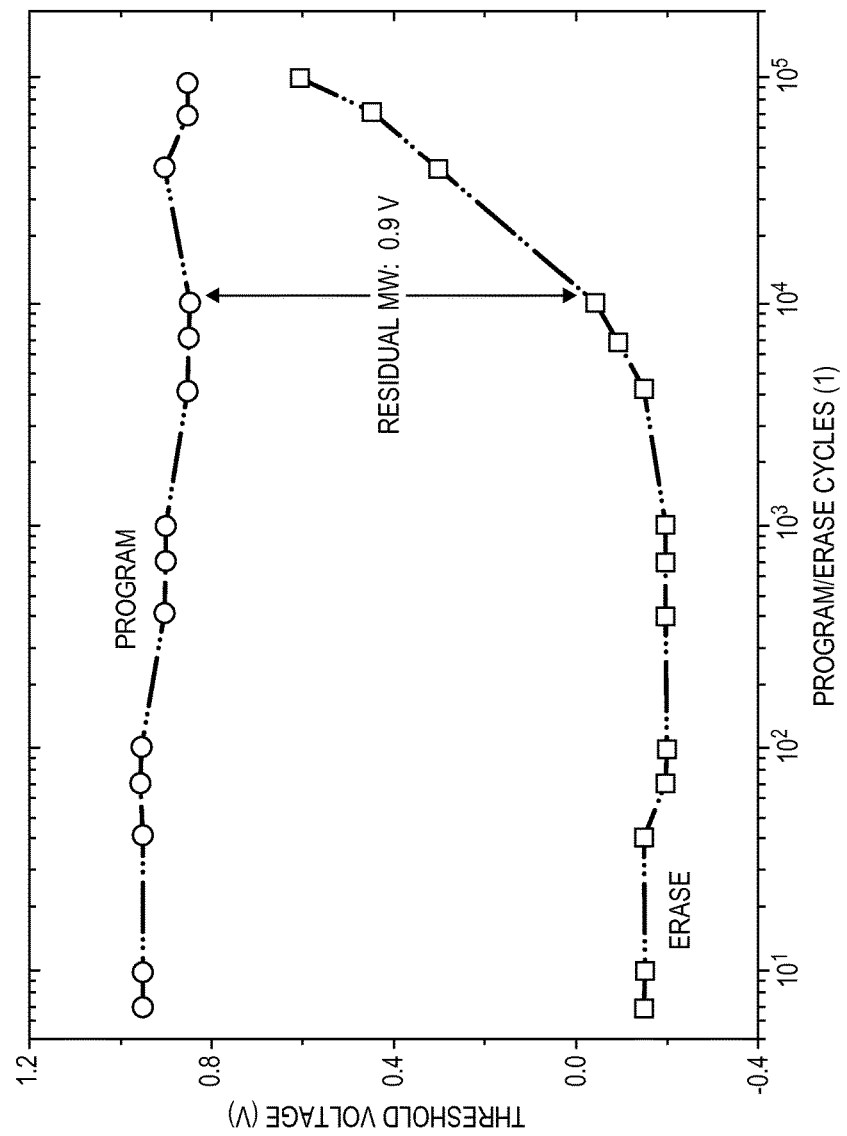
FIG. 5E shows the endurance of an FeFET memory cell.

FIG. 5E shows the endurance of an exemplary ferroelectric hafnium oxide FeFET memory cell. FIG. 5E illustrates the number of times an FeFET memory cell can be written to and still have a discernable memory window.

Figure 5F:
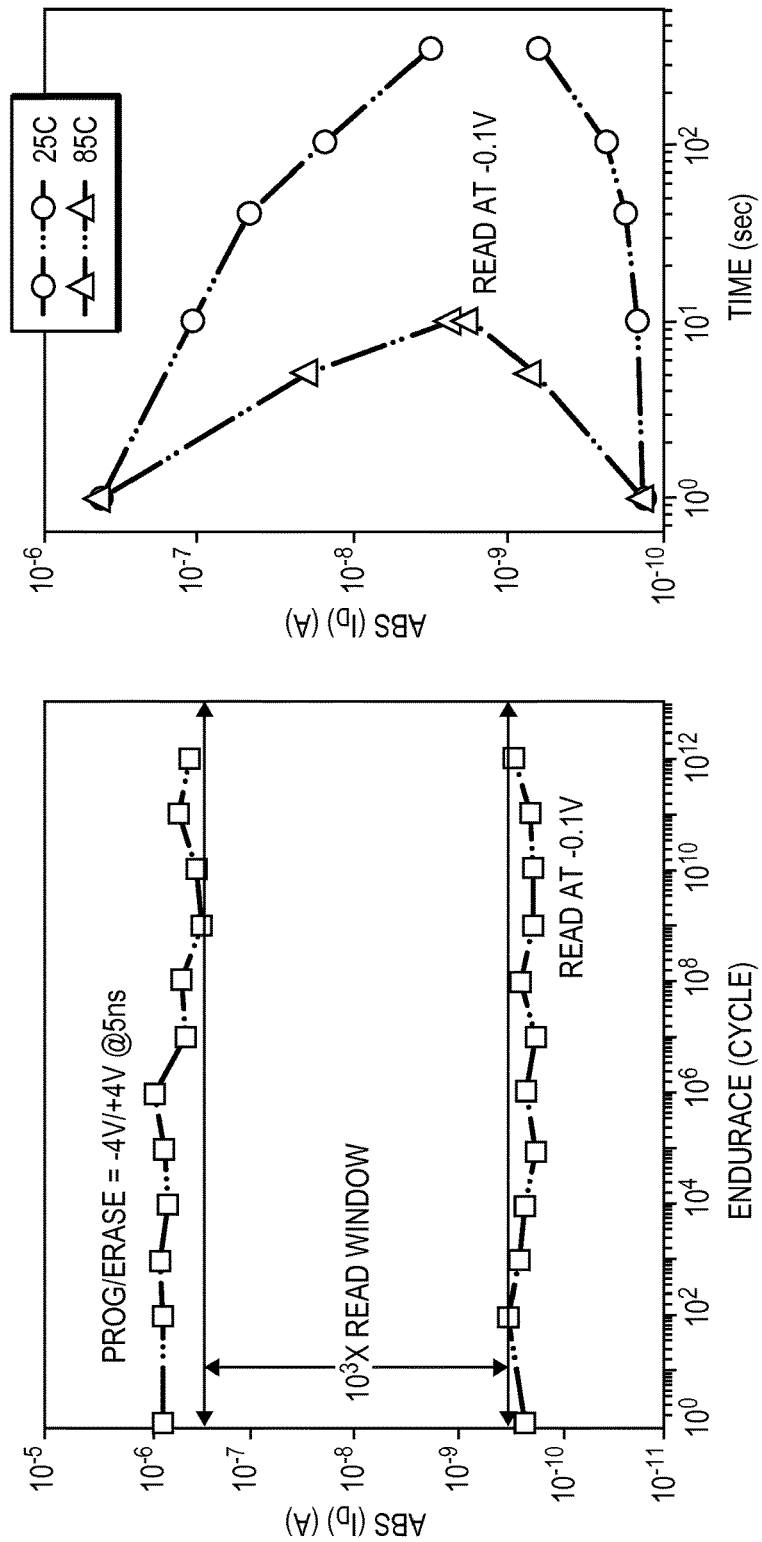
FIG. 5F juxtaposes the data of FIGS. 5D and 5E to illustrate the properties of an FeFET memory cell.
Figure 5G:
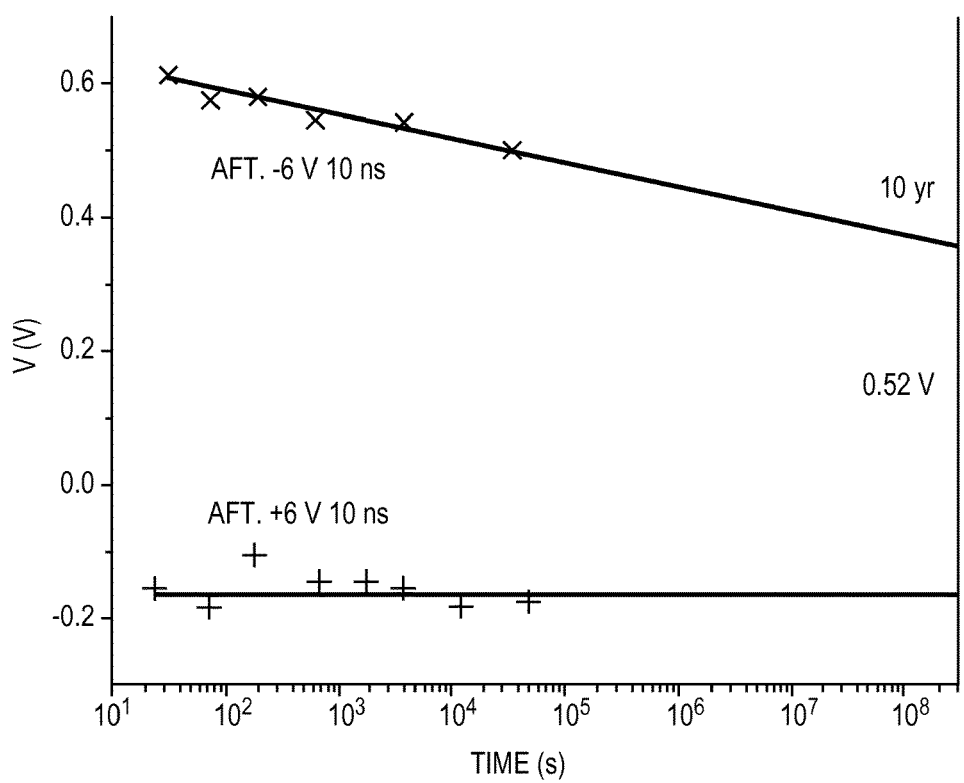
FIG. 5G is a version of FIG. 5D that illustrates the data retention of an FeFET memory cell.
Figure 5H:
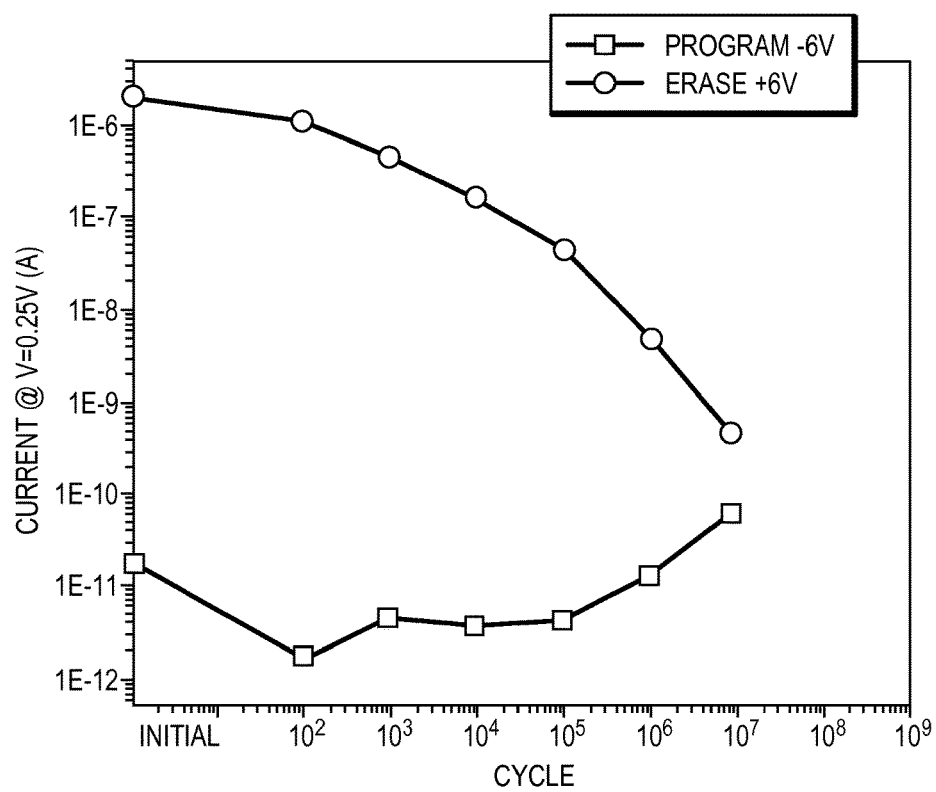
FIG. 5H is a version of FIG. 5E that illustrates the endurance of an FeFET memory cell.

FIG. 5F juxtaposes the data of FIGS. 5G and 5H to show that an exemplary hafnium oxide FeFET memory cell can have high endurance with decreased retention by reducing the programming pulse strength.

FIG. 5G is a version of FIG. 5D depicting the same.

FIG. 5H is a version of FIG. 5E depicting the same.

FIG. 5 depict several non-limiting examples of embodiments for programming FeFET memories in accord with the present invention. As is evident from these examples, retention time is increased when a stronger programming pulse is used. One who is skilled in the art will appreciate that there is an inherent power relationship between current and voltage. Accordingly, one can achieve longer data retention in an FeFET memory by differing durations by varying the power characteristics used to program data to the FeFET memory. One can analogously achieve higher endurance in a FeFET memory by differing durations by varying the power characteristics used to program data to the FeFET memory. Finally, one can take as a whole both retention and endurance together in programming FeFET memory by differing durations by varying the power characteristics used to program data to the FeFET memory.

Varying data retention can be useful to various applications and offer improved thermal and power characteristics. One benefit to a longer data retention is that since there will be a longer interval between refreshes, the FeFET memory will use less energy to operate. Another benefit to a longer retention is that the FeFET memory itself will produce less heat due to longer intervals between refresh cycles, which in turn can result in a reduction in cooling costs and overall energy used for cooling. Another benefit to longer retention is that more of the memory will be accessible at any given time, reducing the average access time.

One of ordinary skill in the art will note that the optimal operating parameters are not necessarily those that would program the FeFET memory cell for the longest retention every time. Such parameters would result in a higher-than-necessary current being applied if, for example, subsequent operations were expected to reprogram the FeFET memory cell contents. Thus it is necessary to determine how much power is actually required depending on, e.g., the nature of the operations using FeFET memory.

Another dimension of FeFET memory programming is duration of the voltage being applied. By applying voltages for different durations as illustrated in FIG. 5C, a different relationship between endurance (i.e., device life) and data retention is achieved in the FeFET memory cell.

One of ordinary skill in the art will appreciate that endurance and retention characteristics are related to acceptable error rate, which in turn may be a consideration in defining optimal operating parameters. Soft error mitigation may be a consideration in choosing programming characteristics.

One of ordinary skill in the art will appreciate that given the exemplary properties shown in FIGS. 5A-5F, there is a very large range of combinations of voltage and duration that will achieve different combinations of data retention and endurance. Because of this flexibility, there can be tremendous benefits from varying the voltage applied or the duration of the charge in certain situations.

For example, while traditional longer-duration higher-voltage programming may be suitable for traditional longer storage applications, lower-voltage shorter-duration programming may be preferable low power program operations. For completeness, shorter-duration higher-voltage and longer-duration lower-voltage programming can be used for various other applications and are just as desirable for optimization of power characteristics. As a non-limiting example, these can be used in sensor networks where high performance is required after long periods of standby.

Figure 6:
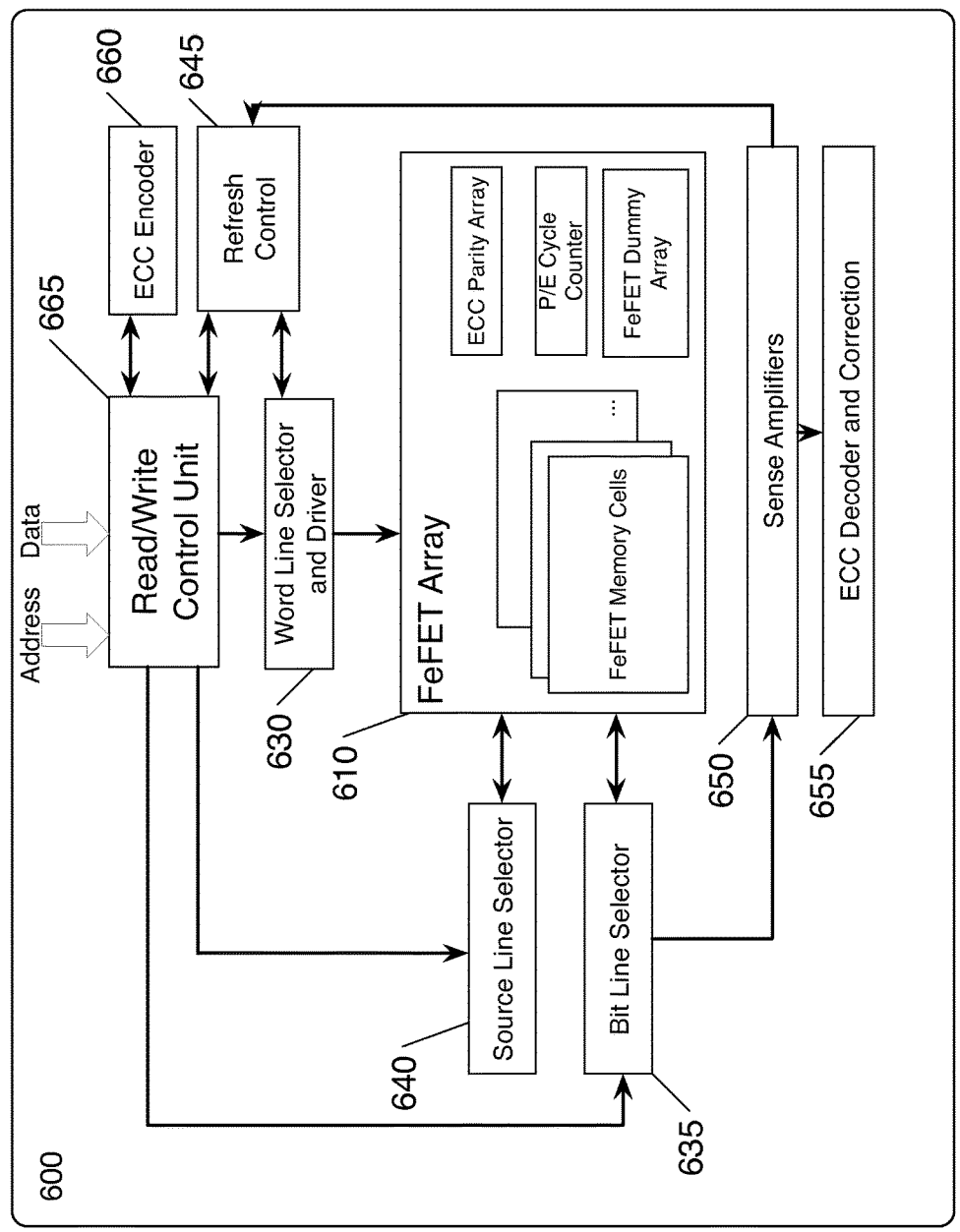
FIG. 6 is a block diagram of an exemplary embodiment of an FeFET memory array.

FIG. 6 depicts a logical diagram for one embodiment of an FeFET memory circuit, which can be used in either non-volatile or volatile applications. Circuit 600 can include any combination of FeFET arrays 610, word line selector and driver 630, bit line selector 635, source line selector 640, refresh circuitry 645, sense amplifiers 650, error checking and correcting units 655, and read/program control circuitry 665. In the embodiment illustrated, there is one of each of these units. However, other embodiments may contain zero or multiples of any of these elements. For more information, please refer to the patent application 62/020,480 filed on Jul. 2, 2014, entitled, "CIRCUITRY FOR FERROELECTRIC FET-BASED DYNAMIC RANDOM ACCESS MEMORY AND NON-VOLATILE MEMORY," and naming Xiao Sun and Tso-Ping Ma as inventors, the disclosure of which is hereby incorporated by reference in its entirety.

Furthermore one of ordinary skill in the art would note that a full FeFET memory product may contain one or more of circuit 600 and that each circuit 600 may include different combinations or numbers of the illustrated elements. For example one circuit 600' may contain error checking and correcting units 655 while another circuit 600" does not. However, circuit 600' may be in electrical contact with 600" so that the units 655 within circuit 600' communicate with circuit 600", etc.

In order to implement the different levels of data retention as previously described, read/program control circuitry 665 may be enhanced beyond the standard read/program circuitry. In addition to the standard circuitry, an optional input can be added that overrides the "normal" operating parameters.

Figure 7:
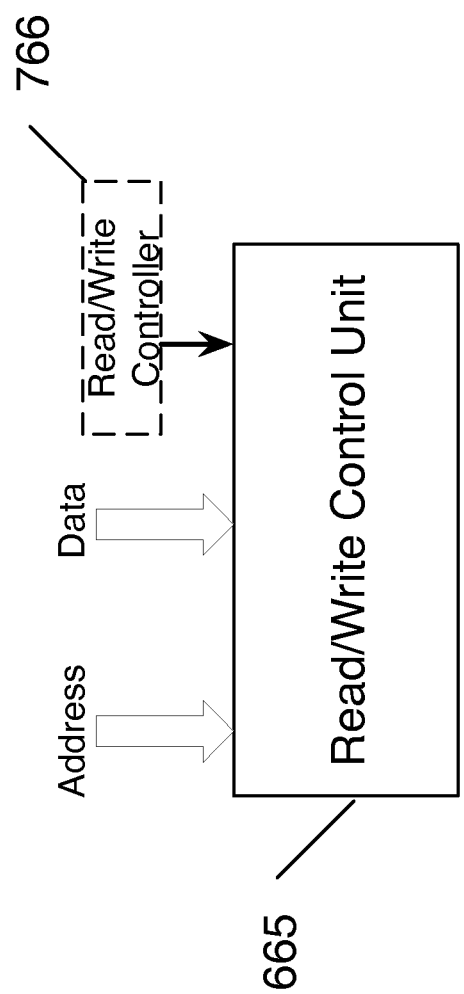
FIG. 7 is a block diagram depicting standard and accessory inputs to the FeFET memory read/program control circuitry of FIG. 6.

This additional input can be specified in many ways and is depicted in FIG. 7 by read/program controller 766. Note that read/program controller 766 is an optional component of FeFET memory and that other circuitry normally included as part of read/program controller 665 is not otherwise depicted in figure. One exemplary embodiment of read/program controller 766 is a multiplexer that selects a different current, voltage, or programming time depending on the type of operational instruction that is currently being executed. This operation type may be communicated to the read/program controller 766 through an external source as part of the instruction set.

Another embodiment of read/program controller 766 would measure the interval between successive programming to memory cells of read/program control circuitry 665. If the average interval between successive programs is short, it means the memory is being changed constantly and a lower current and voltage combination could be utilized. If the average interval between programs is long, then a higher voltage and current combination may be utilized.

One of ordinary skill in the art would note that the embodiments described for read/program controller 766 need not be implemented physically on an FeFET memory. The read/program controller function 766 could come from an external source such as, e.g., the processor itself 120.

Figure 8:
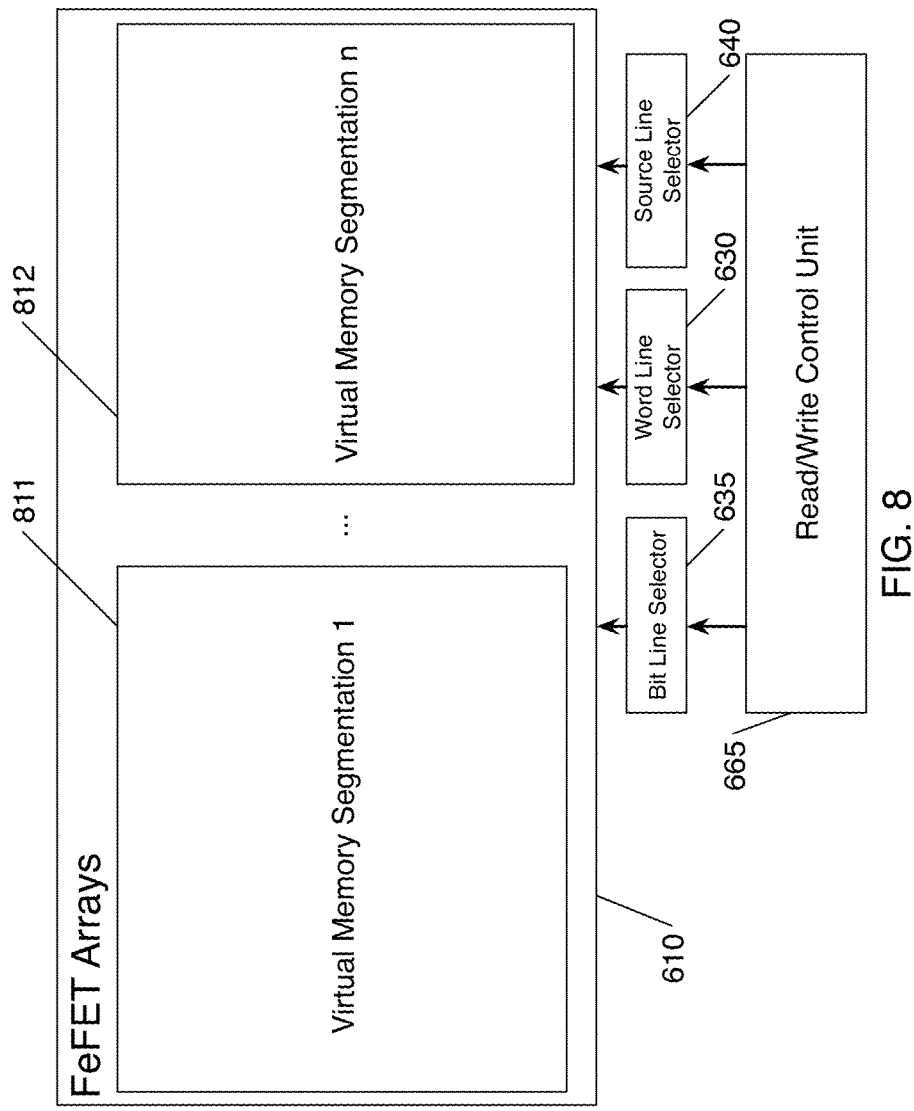
FIG. 8 is a block diagram depicting a segmentation scheme of an FeFET memory array in accord with the present invention.

FIG. 8 depicts one embodiment of the present invention that utilizes virtual segmentation in connection with the FeFET memory cells. The FeFET memory array 800 includes a plurality of segmentations 811, 812, etc. Each segmentation 811, 812, etc. corresponds to a range of FeFET memory cells that are being written to using certain electrical characteristics for a particular data retention. For the following example, segmentation 811 refers to a lower power, shorter data retention range while the segmentation 812 refers to a higher power, longer duration data retention range.

While it is possible to program each FeFET memory cell specifically, the management of such operations may result in an impractical amount of overhead. By creating segmentations within the FeFET memory itself, the DRAM layer of the memory tree utilizing FeFET memory more closely resembles the data cache layer (L1 cache, L2 cache, L3 cache, etc.). In an analog as to how cache operations are executed on the data cache of a processor, the different segments within FeFET memory could have different settings of normalized operations that would approximate the optimal configuration of programming voltage and current for the particular desired refresh characteristics for that segment.

For example in a computer that has multiple operations occurring at the same time, a web browser session with a streaming video may be loaded. In this instance, the data for the browser session and the thumbnail placeholder for the video itself would be loaded into segmentation 812 because they correspond to an operation that is less likely to require reprogramming of the contents in segmentation 812. However, if the video began playback, the memory operations resulting from the display of the video would get saved into segmentation 811 because while the video is playing, the memory contents are more likely to change rapidly.

One of ordinary skill in the art will appreciate that while only two segmentations 811 and 812 are shown, there can be any number of segmentations within an array of FeFET memory. Furthermore, one can appreciate that the number of segmentations could dynamically change during operation. During the dynamic process, different segmentations could be added that have either a shorter retention or a longer retention depending on the characteristics of the data set that need to be stored within the FeFET memory.

Figure 8A:
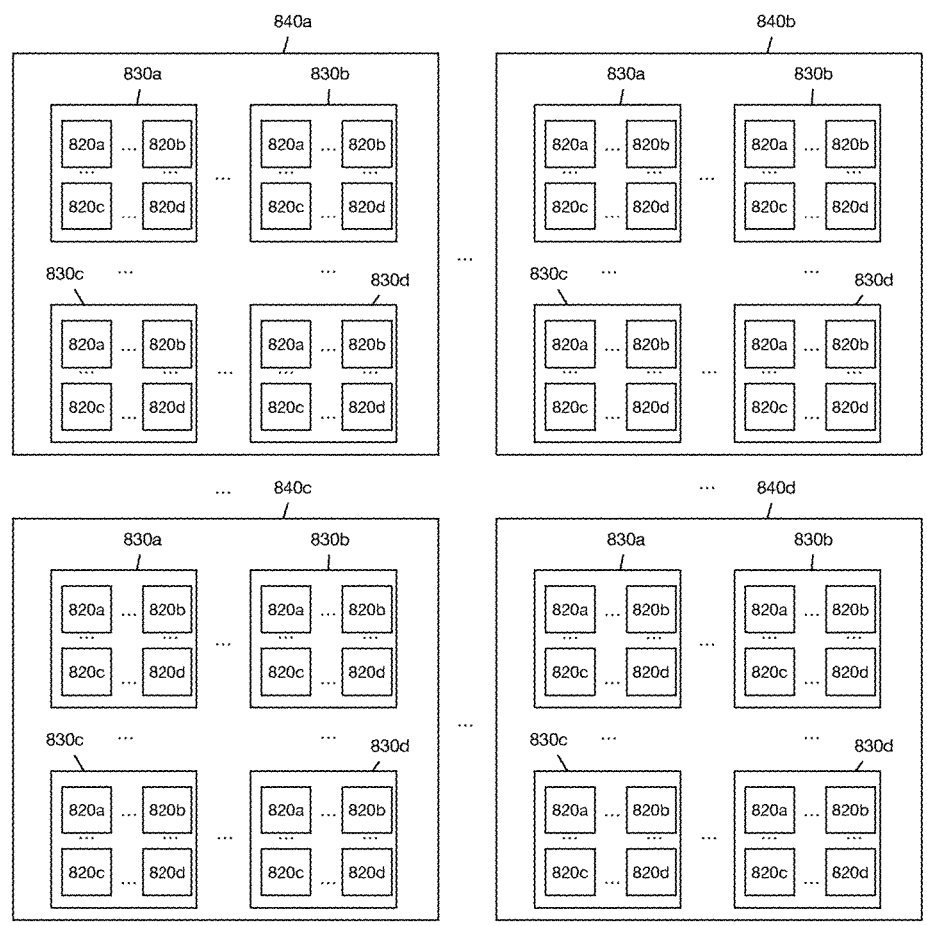
FIG. 8A is a block diagram depicting an exemplary representation of FeFET memory within a computer system.

FIG. 8A depicts the architecture of an exemplary FeFET memory. Each FeFET memory includes a plurality of physical units 840a, 840b, etc. Physical units are memories in physically separate packages. These separately packaged units may be mounted in two dimensions as on a printed circuit board (PCB) and/or stacked in three dimensions as in package on package (PoP) configurations.

Each physical unit 840 includes a plurality of sets 830a, 830b, etc. These sets need not be of equal size or function. Any plurality of sets 830 may be combined to form a larger set. Sets 830 may include any grouping of memory elements that are housed in the same package 840, including three dimensional stacking of FeFET memory on the same die, and stacked chips within the same package 840.

Each set 830 comprises one or more minimal addressable memory elements 820a, 820b, etc. These elements are the smallest addressable unit within the FeFET memory. Sets 830 may also comprise other sets 830, with an arbitrary number of levels of sets 830 possible.

Figure 8B:
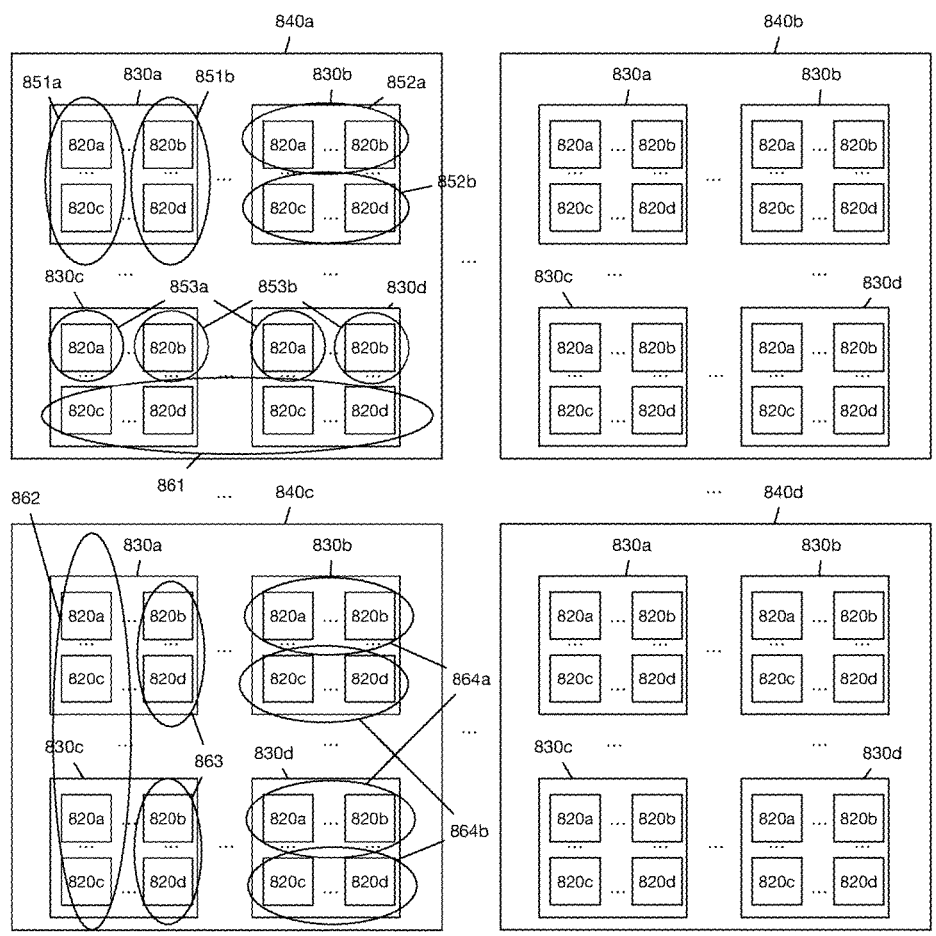
FIG. 8B is a block diagram depicting an exemplary representation of FeFET memory within a computer system with exemplary embodiments of segmentation schemes.

FIG. 8B depicts an exemplary segmentation of an FeFET memory. Physical array 840a comprises multiple segments. Segments 851a, 851b etc. comprise memory elements within set 830a, arranged in a certain way. Segments 852a, 852b, etc. comprise memory elements within set 830b, arranged in a certain way which is distinct from that of segments 851a, 851b etc. Segments 851 may include elements of multiple sets 830, as 853a comprises minimal addressable memory elements 820a within sets 830c, 830d, etc. Similarly segment 853b comprises minimal addressable memory elements 820b within sets 830c, 830d, etc. Without limitation, groupings such as 853a and 853 can occur across any number of sets 830 or packages 840. Segment 861 includes an arrangement of elements 820c, 820d, etc. across multiple sets 830c, 830d, etc.

Segment numbering above 850 is meant to correspond to segments previously described in segmentations 811 and 812. Different numbering patterns are used to distinguish how the segments are grouped together based on the different combinations of possible segments. Not all exhaustive embodiments are depicted, but should be assumed to be covered.

Physical array 840c comprises multiple segments arranged differently from those of 840a. Segment 862 comprises elements 820a, 820c, etc. across multiple sets 830a, 830c etc. where said sets are arranged differently from those of set 861. Segments 863, 864a, and 864b comprise elements of multiple sets.

Figure 8C:
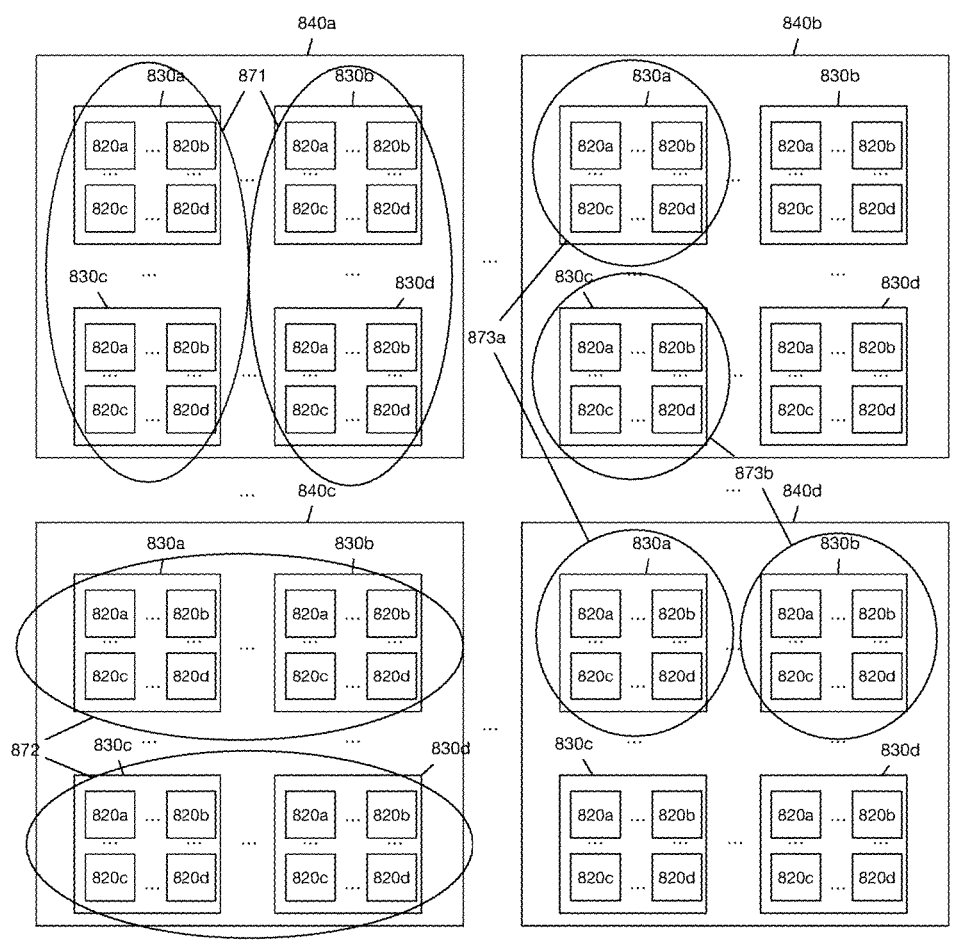
FIG. 8C is a block diagram depicting an exemplary representation of FeFET memory within a computer system with more exemplary embodiments of segmentation schemes.

FIG. 8C depicts an exemplary segmentation of an FeFET memory. Segment 871 comprises a plurality of sets 830a, 830c, etc. and 830b, 830d etc. arranged in a certain way. Segment 872 is similarly comprised of a plurality of sets 830a, 830b etc. and 830c, 830d etc., arranged in a certain way which is distinct from the arrangement of 871. Segment 873a comprises sets 830a in a plurality of physical arrays 840b, 840d, etc. Segment 873b comprises a plurality of sets 830b, 830c etc. across a plurality of physical arrays 840b, 840d etc.

Figure 8D:
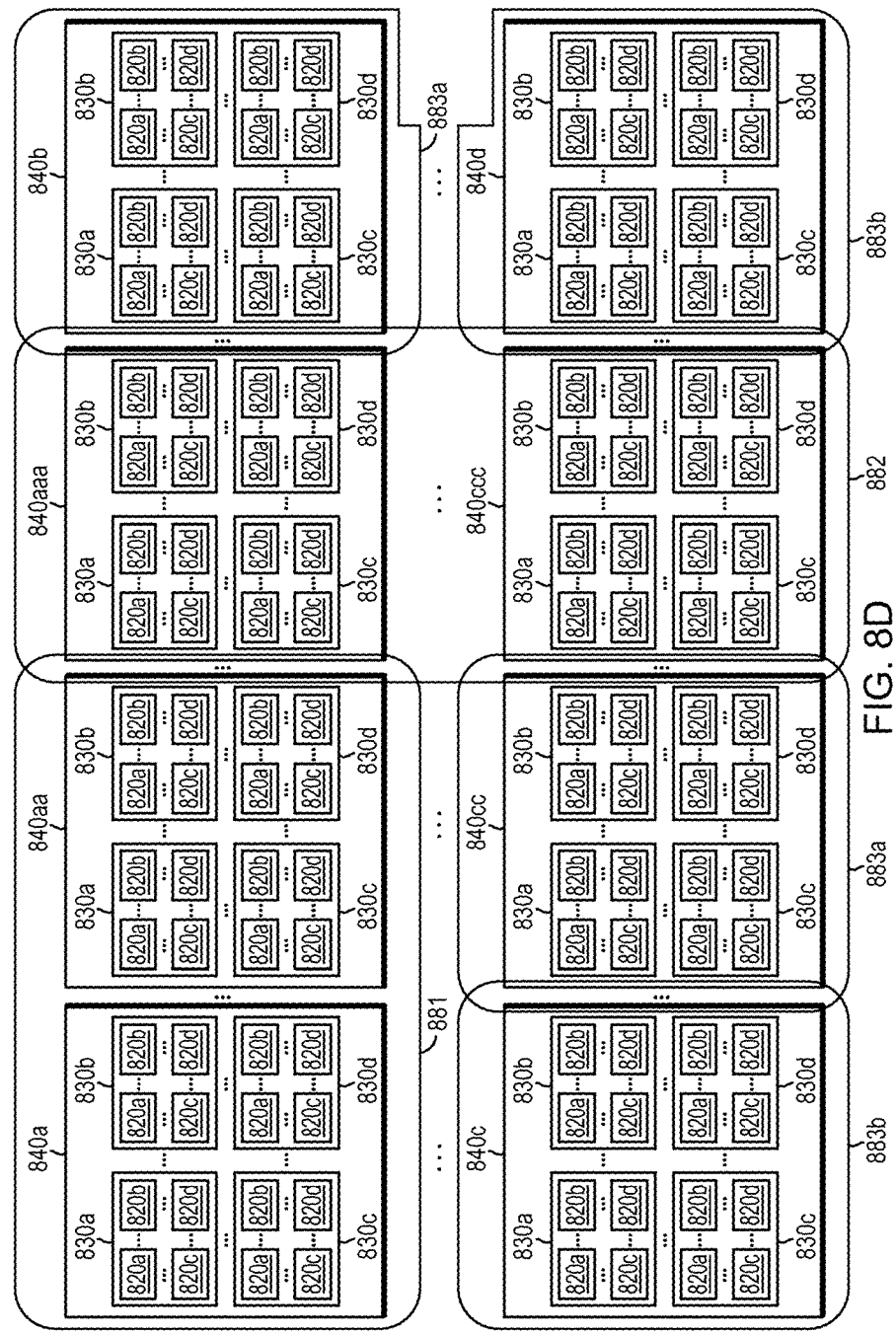
FIG. 8D is a block diagram depicting an exemplary representation of FeFET memory within a computer system with even more exemplary embodiments of segmentation schemes.

FIG. 8D depicts an exemplary segmentation of an FeFET memory. Segment 881 comprises a plurality of physical arrays 840a, 840aa, etc. arranged in a certain way. Segment 882 comprises a plurality of physical arrays 840aaa, 840ccc, etc., arranged in a certain way which is distinct from that of segment 881.

Segment 883a comprises a plurality of physical arrays 840b, 840cc etc. arranged in a certain way. Segment 883b comprises a plurality of physical arrays 840c, 840d etc., arranged in a certain way which is distinct from that of 883a.

The implementation of the segmentation behavior may vary depending on the product using the FeFET memory. For example, a graphics card driving displays is likely to have different segmentations than, e.g., an FeFET memory used with the main central processor(s). In fact, segmentation may be implemented using, e.g., physically separate instances of FeFET memory that correspond to different types of operations. Within a graphics card, certain parts of the screen may be allocated to a lower power segmentation because they are less likely to change from frame-to-frame. In contrast, memory used for computations to represent objects and 3-dimensional physics would be allocated to a higher power segmentation to address their likely need to change due to the constantly changing nature of the computations.

It is important to note that within the virtual segmentation, not all cells need to remain mapped to the same segmentation. In fact, the mapping of individual FeFET memory cells may change due to the endurance of the cells, i.e., the number of times the memory cell can be written to before it is no longer expected to function reliably. By varying the virtual mapping of cells among segments, it is possible to equalize the endurance of individual cells and prevent, e.g., a failure of one overused cell while other underused cells continue to operate. One embodiment of an approach to achieve such a mapping is to simply randomly assign the cells each time a segmentation occurs, such as when the computer changes from a powered off state to a powered on state.

As referenced in FIG. 2, one embodiment of the invention could be a scenario in which data cache 130 and volatile memory 241 are combined in a single physical FeFET memory. In this embodiment, some number of virtual segmentations 811, 812, etc. could be implemented to accomplish the same functionality as both the data cache and volatile memory in an embedded application.

Embodiments of the present disclosure, for example, are described above with reference to block diagrams and/or operational illustrations of methods, systems, and computer program products according to embodiments of the present disclosure. The functions/acts noted in the blocks may occur out of the order as shown in any flowchart. For example, two blocks shown in succession may in fact be executed substantially concurrent or the blocks may sometimes be executed in the reverse order, depending upon the functionality/acts involved. Additionally, not all of the blocks shown in any flowchart need to be performed and/or executed. For example, if a given flowchart has five blocks containing functions/acts, it may be the case that only three of the five blocks are performed and/or executed. In this example, any of the three of the five blocks may be performed and/or executed.

The description and illustration of one or more embodiments provided in this application are not intended to limit or restrict the scope of the present disclosure as claimed in any way. The embodiments, examples, and details provided in this application are considered sufficient to convey possession and enable others to make and use the best mode of the claimed embodiments. The claimed embodiments should not be construed as being limited to any embodiment, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate embodiments falling within the spirit of the broader aspects of the general inventive concept embodied in this application that do not depart from the broader scope of the claimed embodiments.

The invention claimed is:

1. A method for programming a ferroelectric memory, the method comprising:

(a) selecting, using a controller, at least one desired performance characteristic for data to be stored in a ferroelectric memory;
(b) dynamically computing, using the controller, at least one signal characteristic for a signal to be used to store the data in the ferroelectric memory, the signal characteristic satisfying the at least one desired performance characteristic; and
(c) dynamically applying, using the controller, a signal having the at least one determined signal characteristic to the ferroelectric memory to store the data with the at least one desired performance characteristic.

2. The method of claim 1 wherein the at least one desired performance characteristic is at least one of a desired retention characteristic, a desired endurance characteristic, a desired speed characteristic, and a desired energy characteristic.

3. The method of claim 1 wherein the ferroelectric memory is ferroelectric field effect transistor memory or ferroelectric random access memory.

4. The method of claim 1 wherein the at least one desired performance characteristic is selected from the group consisting of retention time, interval between refresh, read speed, set speed, read energy, set energy, refresh energy, read current, set current, refresh current, and read-out window.

5. The method of claim 1 wherein the signal characteristic is selected from the group consisting of signal current, signal voltage, signal power, signal duration, and signal waveform structure.

6. The method of claim 1 wherein the signal characteristic is selected to satisfy at least one of a constraint on power consumed, a constraint on electromagnetic field generation, a constraint on available voltage levels, a constraint on endurance, a constraint on error rate, and a constraint on retention time.

7. The method of claim 1 wherein the at least one desired performance characteristic is a desired error-rate characteristic.

8. The method of claim 1 wherein the at least one desired performance characteristic is is-selected based on an operation being executed by a microprocessor.

9. The method of claim 1 wherein the at least one desired performance characteristic is selected based on the timing of successive data storage operations.

10. The method of claim 1 wherein (b) and (c) are non-blocking operation.

11. A system for programming a ferroelectric memory, the system comprising:
a ferroelectric memory; and
a controller configured to read data from and write data to the ferroelectric memory,
wherein the controller:
dynamically computes at least one signal characteristic for a signal to be used to write data to the ferroelectric memory based on at least one desired performance characteristic for the data to be stored in the ferroelectric memory; and
dynamically applies the signal having the at least one computed signal characteristic to the ferroelectric memory to store the data with the at least one desired performance characteristic.

12. The system of claim 11 wherein the at least one desired performance characteristic is at least one of a desired retention characteristic, a desired endurance characteristic, a desired speed characteristic, a desired energy characteristic, and a desired error-rate characteristic.

13. The system of claim 11 wherein the ferroelectric memory is a ferroelectric field effect transistor memory lacking a capacitor or other secondary storage component.

14. The system of claim 11 wherein the controller selects the desired performance characteristic from the group consisting of retention time, interval between refresh, read speed, set speed, read energy, set energy, refresh energy, read current, set current, refresh current, and read-out window.

15. The system of claim 11 wherein the controller selects the signal characteristic from the group consisting of signal current, signal voltage, signal power, signal duration, and signal waveform structure.

16. The system of claim 11 wherein the controller selects the signal characteristic to satisfy at least one of a constraint on power consumed, a constraint on electromagnetic field generation, a constraint on available voltage levels, a constraint on endurance, a constraint on error rate, and a constraint on retention time.

17. The system of claim 11 wherein the controller is selected from the group consisting of a multiplexer and a microprocessor.

18. The system of claim 11 further comprising a microprocessor, wherein the controller selects the desired performance characteristic based on an operation being executed by the microprocessor.

19. The system of claim 11 wherein the dynamic computation of the at least one signal characteristic and the dynamic application of the signal having the at least one determined signal characteristic are non-blocking operations.

20. The system of claim 11 further comprising a plurality of ferroelectric memories and wherein the ferroelectric memory for storage is selected from the plurality of ferroelectric memories based on the desired performance characteristic.

* * * * *